(12) United States Patent
Kim

(10) Patent No.: US 9,048,208 B2
(45) Date of Patent: Jun. 2, 2015

(54) ORGANIC LIGHT EMITTING DISPLAY AND FABRICATING METHOD THEREOF

(71) Applicant: SAMSUNG DISPLAY CO., LTD., Yongin, Gyeonggi-Do (KR)

(72) Inventor: Tae-Kyu Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/321,033

(22) Filed: Jul. 1, 2014

(65) Prior Publication Data
US 2015/0008410 A1    Jan. 8, 2015

(30) Foreign Application Priority Data
Jul. 2, 2013    (KR) .................. 10-2013-0077107

(51) Int. Cl.
  H01L 51/54    (2006.01)
  H01L 27/32    (2006.01)
  H01L 51/56    (2006.01)
(52) U.S. Cl.
  CPC ............ *H01L 27/3248* (2013.01); *H01L 51/56* (2013.01)
(58) Field of Classification Search
  CPC ..................... H01L 27/3248; H01L 51/56

USPC ................ 438/29, 34, 35, 58; 257/40, 88, 99, 257/E51.018, E51.022, E51.024, E27.119
See application file for complete search history.

(56) References Cited

U.S. PATENT DOCUMENTS

| | | | |
|---|---|---|---|
| 8,772,767 B2 * | 7/2014 | Dobbs et al. .................... | 257/40 |
| 2008/0036706 A1 | 2/2008 | Kitazawa | |
| 2010/0176383 A1 | 7/2010 | Park et al. | |
| 2012/0091482 A1 * | 4/2012 | Uchida et al. .................. | 257/88 |
| 2013/0001532 A1 * | 1/2013 | Hwang et al. .................. | 257/40 |
| 2014/0175390 A1 * | 6/2014 | Kim et al. ........................ | 257/40 |
| 2014/0346453 A1 * | 11/2014 | Koo et al. ....................... | 257/40 |

FOREIGN PATENT DOCUMENTS

| | | |
|---|---|---|
| KR | 10-2008-0013730 | 2/2008 |
| KR | 10-2010-0082940 | 7/2010 |
| KR | 10-2012-0047003 A | 5/2012 |

* cited by examiner

*Primary Examiner* — Dao H Nguyen
(74) *Attorney, Agent, or Firm* — Lee & Morse, P.C.

(57) ABSTRACT

A method of making a display device includes forming first electrodes of organic light emitting diodes in respective pixel areas on a substrate, forming a first common layer on the first electrodes in the pixel areas, forming emission layers in the pixel areas on the first common layer, forming a second electrode of the organic light emitting diodes on the emission layer, and applying physical pressure to divide the first common layer.

15 Claims, 6 Drawing Sheets

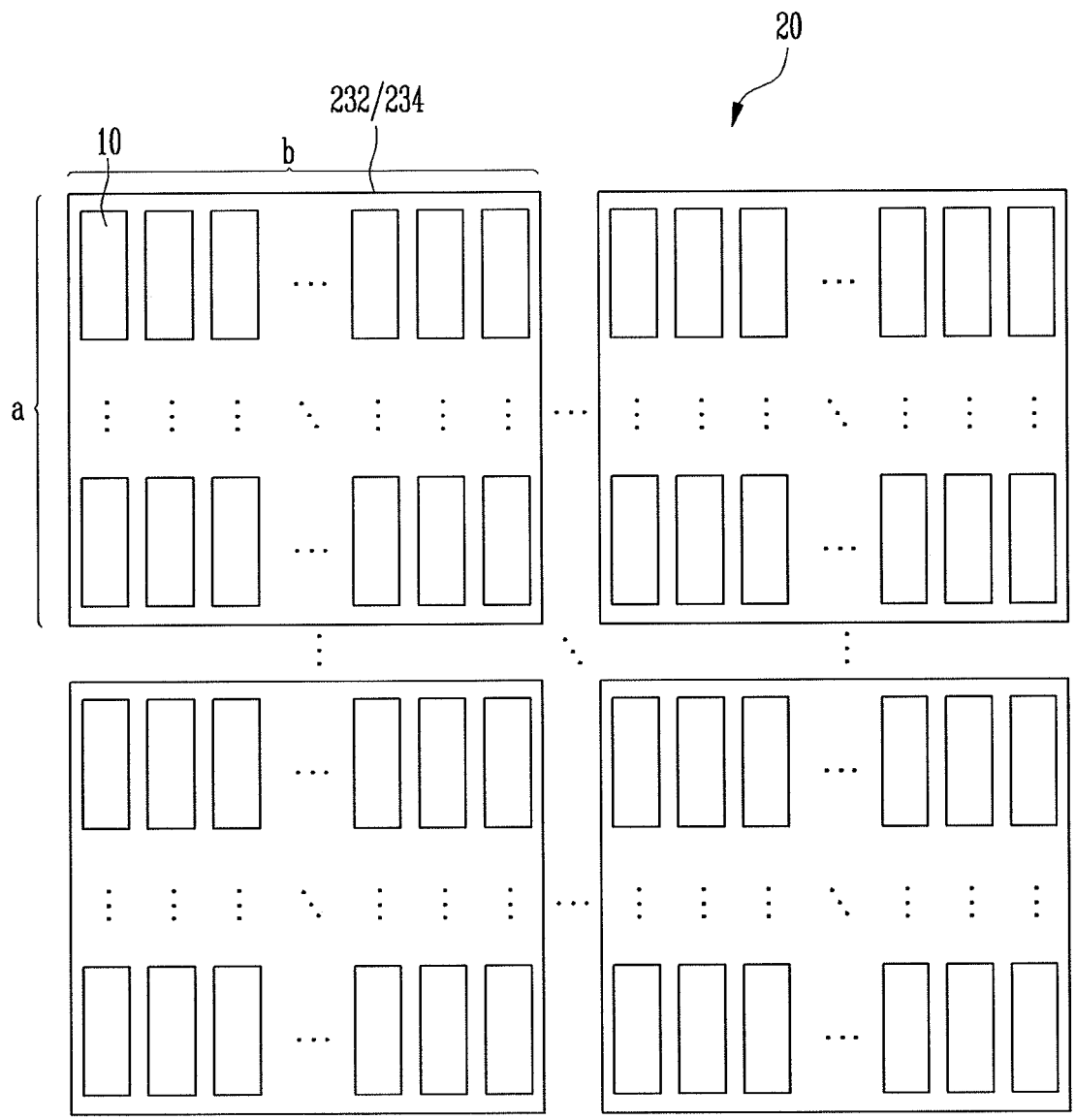

ORGANIC LIGHT EMITTING DISPLAY AND FABRICATING METHOD THEREOF

CROSS-REFERENCE TO RELATED APPLICATION

Korean Patent Application No. 10-2013-0077107, filed on Jul. 2, 2013, and entitled, "Organic Light Emitting Display and Fabricating Method Thereof," is incorporated by reference herein in its entirety.

BACKGROUND

1. Field

One or more embodiments described herein relates to a display device.

2. Description of the Related Art

The performance of displays must increase as information technology evolves. Flat panel displays have been developed in pursuit of this goal. One type of flat panel display, known as an organic light emitting diode (OLED) display, has pixels which output light based on a recombination of electrons and holes in corresponding active layers. Displays of this type have demonstrated relatively fast response speed, low-voltage driving and power consumption, and excellent viewing angle.

SUMMARY

In accordance with one or more embodiments, a method of making a display device includes forming first electrodes of organic light emitting diodes (OLEDs) in respective pixel areas on a substrate, forming a first common layer on the first electrodes in the pixel areas, forming emission layers in the pixel areas on the first common layer, forming a second electrode of the OLEDs on the emission layer, and applying physical pressure to divide the first common layer. Applying the physical pressure may include applying a force to the first common layer in a different direction of a plane including the substrate.

Applying the physical pressure may include placing a panel on a substrate support having a plurality of grooves, the panel including the first electrodes, the first common layer, the emission layers, and the second electrode, and moving at least one of the panel or the substrate support in a second direction intersecting a first direction, while applying a force in the first direction to divide the first common layer. The substrate support may include first and second regions, each having grooves at a predetermined interval, the grooves in adjacent regions alternately positioned to cross each other. The first direction may be perpendicular to the second direction.

The method may include moving the panel onto the second region on the substrate support when at least one region of the panel is positioned in the first region on the substrate support, wherein moving the panel includes applying the force to the panel in the first direction. Each of the first and second regions of the substrate support may include a plurality of grooves having substantially a same interval and width.

Applying the physical pressure may include applying a force to a panel in a first direction while rotating at least one roller in a second direction crossing the first direction, the at least one roller including a plurality of grooves and the panel including the first electrodes, the first common layer, the emission layers, and the second electrode.

Applying the physical pressure may include rotating a plurality of rollers on the first common layer, each of the rollers having grooves at a predetermined interval and the rollers are rotated so that the grooves of the rollers are alternately positioned.

Applying the physical pressure may include rotating a plurality of rollers on the first common layer, each of the rollers having a plurality of diagonal grooves.

A number k OLEDs may share the first common layer, where k≥2, and one or more pixels having a number smaller than the k pixels may share the divided first common layer. Pixels in a horizontal or vertical line may share the first common layer, and applying the physical pressure may include dividing the first common layer into at least two first common layers. At least two first common layers may be divided relative to the horizontal and vertical pixel lines.

Forming a second common layer on the emission layer may allow a plurality of pixels to share the second common layer, and the second coming layer may be formed between forming the emission layers and forming of the second electrode. The second common layer may be simultaneously divided with the first common layer.

The first electrodes and emission layers may be patterned for corresponding pixels, and the second electrode may be entirely formed on a pixel unit so that all the pixels share the second electrode.

In accordance with another embodiment, an organic light emitting display includes a plurality of pixels, each of the pixels including at least one organic light emitting diode (OLED) which includes: a first electrode and an emission layer in a respective pixel area, a first common layer between the first electrode and emission layer, and a second electrode on the emission layer, a plurality of pixels sharing the first common layer, wherein the first common layer is divided with respect to a horizontal or vertical pixel line.

The first common layer may be disposed to be divided with respect to horizontal and vertical pixel lines. The OLED may include a second common layer between the emission layer and second electrode, and a plurality of pixels may share the second common layer. The second common layer may be divided with respect to a horizontal or vertical pixel line. The first electrode and emission layer may be patterned for a corresponding one of the pixels, and two or more of the pixels may share the second electrode.

BRIEF DESCRIPTION OF THE DRAWINGS

Features will become apparent to those of skill in the art by describing in detail exemplary embodiments with reference to the attached drawings in which:

FIG. 5 illustrates divided common layers of an organic light emitting display;

DETAILED DESCRIPTION

Figure 1:
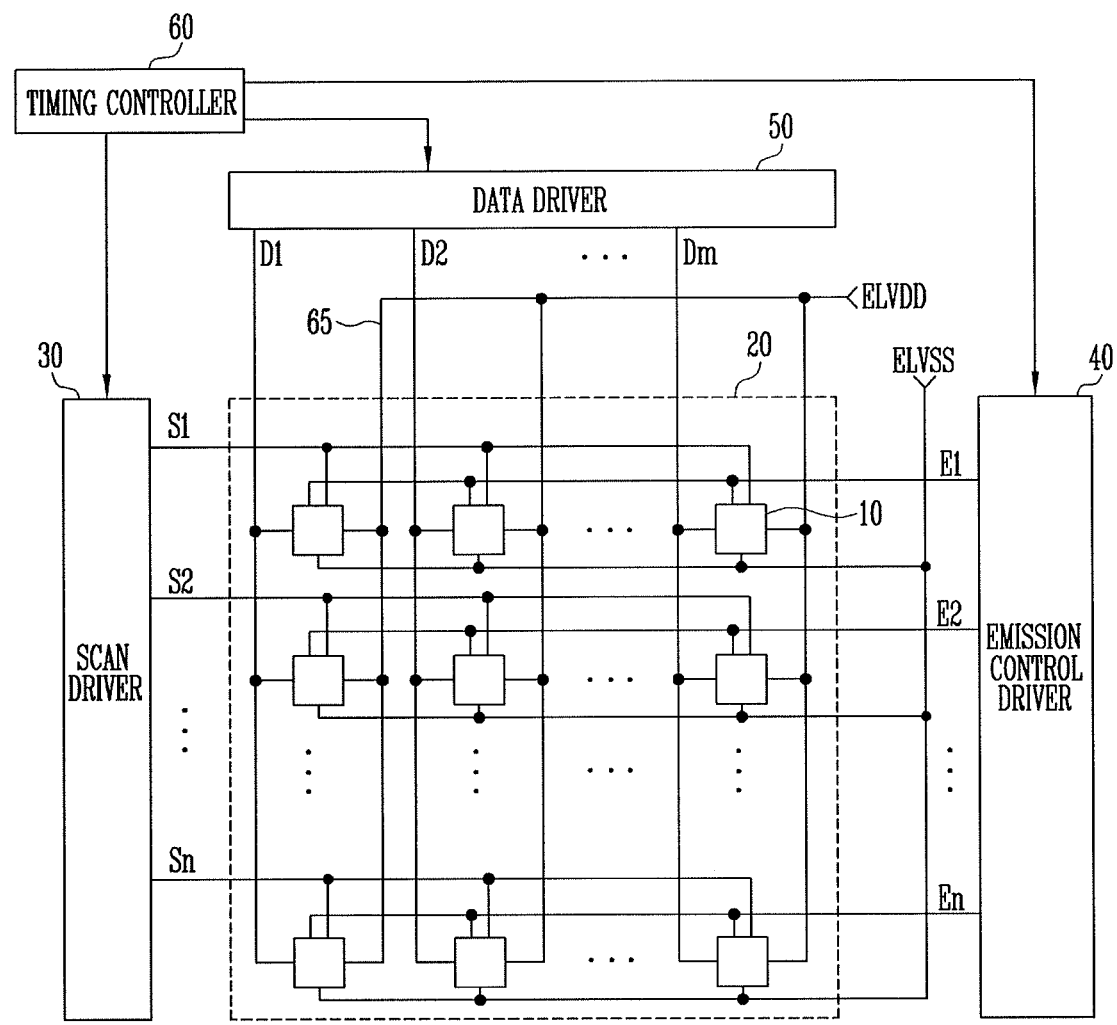
FIG. 1 illustrates an embodiment of an organic light emitting display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
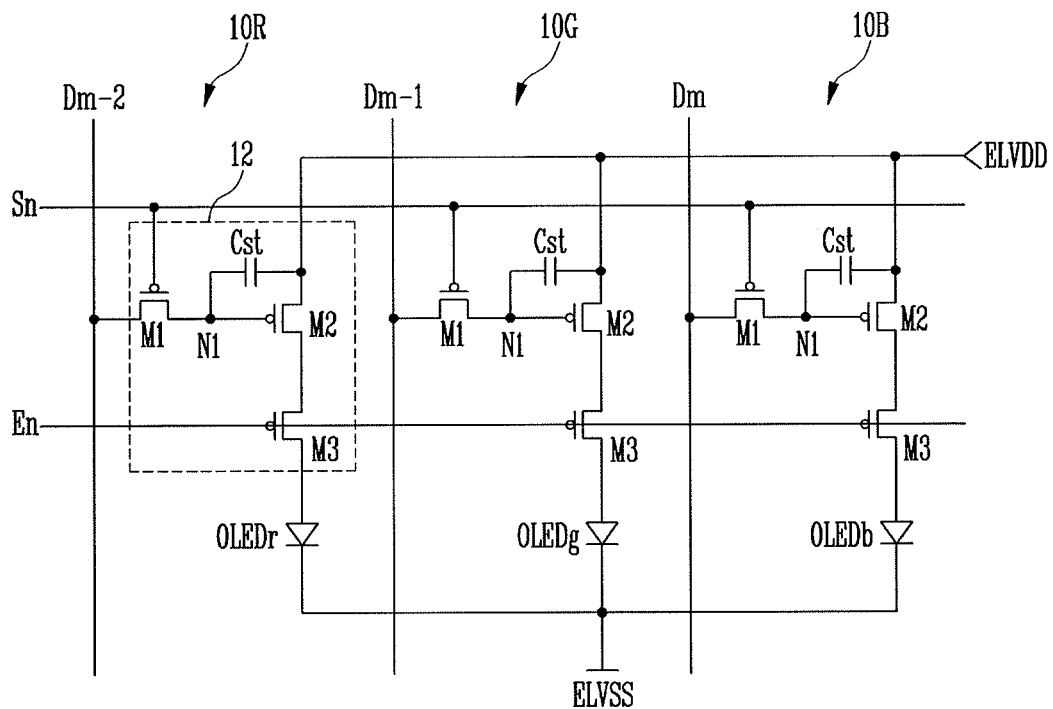
FIG. 2 illustrates an embodiment of a pixel in the display.

FIG. 1 illustrates an embodiment of an organic light emitting display. FIG. 2 illustrates an embodiment of a pixel in FIG. 1. Referring to FIG. 1, the organic light emitting display includes a pixel unit 20, a scan driver 30, an emission control driver 40, a data driver 50, and a timing controller 60.

The pixel unit 20 includes a plurality of pixels 10, each including at least one organic light emitting diode. The pixels 10 may be arranged, for example, in a matrix form at intersection portions of scan lines S1 to Sn and data lines D1 to Dm.

As shown in FIG. 2, pixels 10 include a first color pixel 10R, a second color pixel 10G, and a third color pixel 10B. The first color pixel 10R includes a first color OLEDr emitting light of a first color (e.g., red). The second color pixel 10G includes an OLEDg emitting light of a second color (e.g., green). The third color pixel 10B includes an OLEDb emitting light of a third color (e.g., blue). Adjacent first to third color pixels 10R, 10G, and 10B may be considered to form a pixel unit expressing various colors.

Each pixel 10 may also include a pixel circuit 12 to supply driving current to the OLED. An example of the configuration and operation of each pixel 10 will be described with reference to FIG. 2.

Specifically, each pixel 10 includes a pixel circuit 12 coupled to the OLED. The pixels 10 may be classified into first to third color pixels 10R, 10G, and 10B according to the color of light emitted from their OLEDs.

A first electrode (e.g., an anode electrode) of the OLED is coupled to a first pixel power source ELVDD via the pixel circuit 12. A second electrode (e.g., a cathode electrode) of the OLED is coupled to a second pixel power source ELVSS. The OLED emits light with luminance corresponding to driving current from the pixel circuit 12.

Each pixel circuit 12 may include first to third transistors M1, M2, and M3, and a storage capacitor Cst. In other embodiments, the pixels 10 or pixel circuit 12 may have a different structure.

A first electrode of the first transistor M1 is coupled to a data line D. A second electrode of the first transistor M1 is coupled to a first node N1. The first and second electrodes of the first transistor M1 are different electrodes. For example, when the first electrode is a source electrode, the second electrode is a drain electrode, or vice versa. A gate electrode of the first transistor M1 is coupled to a scan line Sn.

The first transistor M1 is turned on when a scan signal having a predetermined voltage (e.g., a low voltage) is supplied from the scan line, to thereby allow the data line D and first node N1 to be coupled to each other. A data signal of a corresponding pixel 10 is supplied to the data line D. Accordingly, the data signal is supplied to first node N1. The charge corresponding to the data signal supplied to the first node N1 is stored in the storage capacitor Cst.

A first electrode of the second transistor M2 is coupled to the first pixel power source ELVDD. A second electrode of the second transistor M2 is coupled to the first electrode of the OLED via the third transistor M3. A gate electrode of the second transistor M2 is coupled to the first node N1. The second transistor M2 controls the amount of driving current supplied to the OLED, based on the voltage at first node N1.

A first electrode of the third transistor M3 is coupled to the second electrode of the second transistor M2. A second electrode of the third transistor M3 is coupled to the first electrode of the OLED. A gate electrode of the third transistor M3 is coupled to an emission control line En. The third transistor M3 is turned off during a non-emission period in which an emission control signal having a predetermined voltage (e.g., a high voltage) is supplied from the emission control line En. When the third transistor M3 is turned off, the driving current is cut off so that it does not flow through the OLED.

The third transistor M3 is turned on during an emission period, e.g., during which supply of the emission control signal is stopped. The emission period may correspond, for example, to a period in which the voltage of the emission control signal is set to a low voltage. During the emission period, driving current is supplied from the second transistor M2 to the OLED.

One electrode of the storage capacitor Cst is coupled to the first pixel power source ELVDD. The other electrode of the storage capacitor Cst is coupled to the first node N1. The storage capacitor Cst charges to a voltage corresponding to the data signal supplied to the first node N1, and stores this voltage, for example, until a data signal of the next frame is supplied.

The pixel 10 may have a relatively simple structure. For example, pixel 10 may include first transistor M1 for supplying a data signal, storage capacitor Cst for storing the data signal, second transistor M2 for supplying driving current to the OLED, and third transistor M3 for controlling the emission period of the pixel 10, as illustrated in FIG. 2. The pixel 10 may have a different structure in other embodiments. For example, pixel circuit 12 may include other circuit devices such as a transistor device for compensating for the threshold voltage of the second transistor M2 and/or a transistor device for initializing the first node N1.

The pixel 10 is selected by the scan signal from the scan line Sn during a scan period of a corresponding horizontal line. When the scan signal is received, a data signal is transferred from the data line D coupled thereto. In this case, the emission period of the pixel 10 is controlled based on the emission control signal from the emission control line En.

When driving current corresponding to the data signal is supplied to the OLED, pixel 10 emits light with a luminance corresponding to the driving current. However, when a black gray scale value is to be displayed in the pixel in a corresponding period, the data signal may cut off current to the OLED. Accordingly, the OLED does not emit light to thereby display the black gray scale value.

Referring again to FIG. 1, the scan driver 30 selects a pixel line (horizontal pixel line) to receive data signals for each horizontal period in one frame, while supplying a scan signal to scan lines S1 to Sn. For example, the scan driver 30 may progressively select scan lines S1 to Sn and supply the progressively shifted scan signals to the scan lines S1 to Sn.

The emission control driver 40 controls the emission of pixels 10 on at least one pixel line, while supplying emission control signals to emission control lines E1 to En. For example, the emission control driver 40 cuts off driving current flowing through OLED positioned on a corresponding pixel line during a predetermined non-emission period, including a data writing period, of each pixel line. The emission control driver 40 supplies, to emission control lines E, emission control signals which enable driving current to be supplied to the OLED during an emission period of each pixel line.

The data driver 50 generates data signals based on data supplied from the timing controller 60, and supplies the generated data signals to pixels 10 through the data lines D1 to Dm.

The timing controller 60 controls the scan driver 30, emission control driver 40, and data driver 50 based on one or more control signals that may be externally supplied.

In the organic light emitting display configured as described above, when scan signals are supplied from scan driver 30 through scan lines S1 to Sn, pixels 10 receive the data signals from the data driver 50 through corresponding ones of the data lines D1 to Dm. The pixels 10 also receive emission control signals from the emission control driver 40 through corresponding ones of the emission control lines E1 to En.

Then, driving current with an amplitude corresponding to the data signals flow through the OLEDs of respective ones of the pixels during emission periods corresponding to emission control signals, so that pixels 10 emit light with gray scale values corresponding to the data signals.

When a black gray scale is to be displayed in a predetermined pixel 10, the data signal is supplied to cut off the driving current flowing through the a corresponding OLED during a corresponding period. Accordingly, the OLED does not emit light and thereby implements the black gray scale value.

However, a path along which leakage current can flow between pixels 10 may be formed according to the structure of the pixels 10. For example, the OLED in each pixel 10 may include a common layer shared by a plurality of pixels 10, in addition to a first electrode and an emission layer, patterned for each pixel.

In this case, even the pixel 10 receiving a data signal corresponding to a black gray scale value may emit some amount of light. This is because leakage current flows through the common layer due to parasitic resistance in the common layer. Therefore, the OLED of a pixel 10 intended to implement a black gray scale value is weakly turned on. In this case, pixel 10 does not completely express the black gray scale value. Therefore, deterioration of image quality may result. This will be described in detail with reference to FIGS. 3 to 4B.

Figure 3:
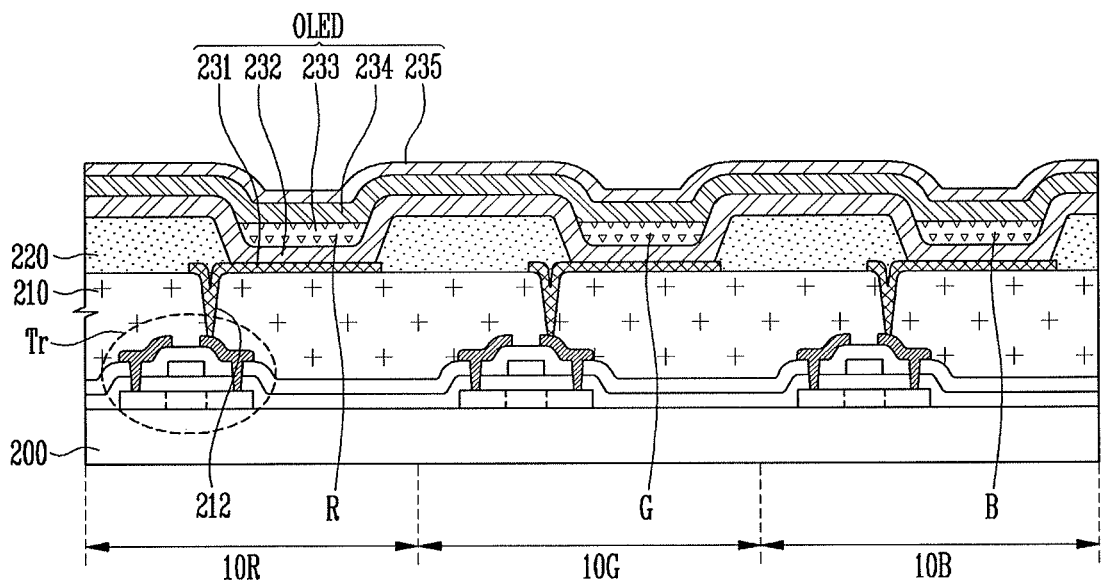
FIG. 3 illustrates a sectional view of the pixel.

FIG. 3 illustrates a main-portion sectional view of the pixel in FIG. 2. For illustrative purposes, only the OLED of each pixel 10R, 10G or 10B in FIG. 2 and a transistor T4 coupled to the OLED will be shown in FIG. 3.

Referring to FIG. 3, an OLED including an emission layer 233 of a corresponding color and a transistor Tr (e.g., the third transistor M3 of FIG. 2) coupled to the OLED are formed in the region of each pixel 10R, 10G, and 10B. Transistor Tr is formed on a substrate 200. A planarization layer 210 is formed on the transistor Tr. Here, the substrate 200 is formed of glass, plastic, silicon, synthetic resin or the like.

The planarization layer 210 may be formed of an insulative material such as a nitride or oxide layer. A via hole 212, through which transistor Tr and the OLED are electrically coupled to each other, is formed in the planarization layer 210.

The OLED coupled to transistor Tr through the via hole 212 is formed on the planarization layer 210. More specifically, the OLED includes a first electrode 231, a first common layer 232, an emission layer 233, a second common layer 234, and a second electrode 235 sequentially formed on the planarization layer 210. The first and second common layers 232 and 234 may be selectively provided. In this embodiment, the OLED includes at least one first common layer 232 and/or at least on second common layer 234.

The first electrode 231 of the OLED may be patterned for each pixel 10R, 10G, and 10B. A pixel defining layer 220 is formed between adjacent pixels 10R, 10G, and 10B, so that the region of each pixel 10R, 10G, or 10B can be defined. The pixel defining layer 220 may be made of, for example, of one or more of an acrylic organic compound or an insulative material such as polyamide or polyimide.

The first common layer 232 is formed on the first electrode 231 of the OLED and pixel defining layer 220. The first common layer 232 may include a hole injection layer and/or a hole transport layer. The first common layer 232 may be formed so that the plurality of pixels 10R, 10G, and 10B share the first common layer 232 for the purpose of convenience in the fabricating process of the organic light emitting display.

For example, the first common layer 232 may be formed in a stripe shape so that at least pixels for each horizontal or vertical pixel line share a single first common layer 232. Alternatively, the first common layer 232 may be entirely formed on the pixel unit, so that all pixels 10R, 10G, and 10B in the pixel unit share a single first common layer 232.

In one embodiment, the first common layer 232 may be commonly formed on the first electrodes of the pixels 10R, 10G, and 10B, which share first common layer 232 and pixel defining layer 220. The first common layers 232 between adjacent pixels 10R, 10G, and 10B may be integrally coupled on the pixel defining layer 220.

The emission layer 233 is formed on the first common layer 232. The emission layer 233 may be patterned for each pixel 10R, 10G, or 10B to overlap first electrode 231. The second common layer 234 is formed on the emission layer 233. The second common layer 234 may include an electron transport layer and/or an electron injection layer.

Like the first common layer 232, the second common layer 234 may be formed so that a plurality of pixels 10R, 10G, and 10B share second common layer 234. In one embodiment, a plurality of second common layers 234 may be patterned in a stripe shape on the pixel unit. Alternatively, a single second common layer 234 may be entirely formed on the pixel unit.

That is, second common layer 234 may be formed to overlap at least electrode 231 and emission layer 233. In this case, the second common layer 234 may extend to the region of the pixel defining layer 220, so that the second common layers 234 between adjacent pixels 10R, 10G, and 10B can be integrally coupled on the pixel defining layer 220.

The second electrode 235 of the OLED may be formed on the second common layer 234. For example, the second electrode 235 may be entirely formed on the pixel unit, but this is not necessary. The second electrode 235 may be patterned to have a variety of shapes.

As described above, an OLED is formed in the area of each of pixels 10R, 10G, or 10B on the substrate 200. The first electrode 231 the emission layer 233 of the OLED is may be patterned in the area of each pixel 10R, 10G, or 10B, and the second electrode 235 of the OLED, for example, may be entirely formed on the pixel unit, so that all the pixels share the second electrode 235.

In one embodiment, the OLED in each pixel 10R, 10G, or 10B may include at least one of a first common layer 232 formed between the first electrode 231 and emission layer 233, or a second common layer 234 formed between the emission layer 233 and second electrode 235. The first common layer 232 and/or the second common layer 234 may be formed so that a plurality of pixels 10R, 10G, and 10B share the first common layer 232 and/or the second common layer 234.

One embodiment of a method of fabricating an organic light emitting display including pixels having OLEDs will now be described. In this embodiment, the method includes forming a first electrode 231 in an area of each pixel 10R, 10G, and 10B. A first common layer 232 is formed on the first electrodes 231 of the OLED, so that a plurality of pixels 10R, 10G, and 10B share the first common layer 232. An emission layer 233 is formed in the area of each pixel 10R, 10G, and 10B on the first common layer 232. A second electrode 235 of the OLED is formed on the emission layer 233.

The method may further include forming a pixel defining layer 220 to define the areas of pixels 10R, 10G, and 10B. The pixel defining layer 220 may be formed between formation of the first electrode 231 of the OLED and formation of the first common layer 232.

The first common layer 232 may be formed on the first electrodes 231 of the OLED, so that k pixels (k is a natural number of 2 or more) share a single common layer 232. For example, in forming first common layer 232, the first common layer 232 may be formed on the first electrodes of the OLEDs, so that pixels 10R, 10G, and 10B on one or more horizontal pixel lines and/or one or more vertical pixel lines share a single first common layer 232. The first common layer 232 may be patterned in a stripe shape on the pixel unit, or may be entirely formed on the pixel unit.

Previously, the second common layer 234 was indicated to be selectively provided with first common layer 232. In other embodiments, the first common layer 232 may be omitted and only the second common layer 234 may be formed.

When the first common layer 232 and/or second common layer 234 are/is formed so that a plurality of pixels 10R, 10G and 10B share the first common layer 232 and/or the second common layer 234, the patterning process may be simplified, thereby improving efficiency of the fabricating process of the organic light emitting display.

However, in a case where leakage current flows via the first common layer 232 and/or the second common layer 234 due to parasitic resistance in the first common layer 232 and/or the second common layer 234, a small amount of light may be generated in one or more of pixels 10R, 10G, or 10B which are intended to implement black gray scale value. Particularly, the second electrode 235 of the OLED is coupled to the second pixel power source ELVSS. Therefore, if leakage current flows in the first common layer 232, a small amount of light may be generated in the emission layer 233.

In order to solve this problem, in one embodiment, the first common layer 232 is divided into first common layers, each having a size smaller than that of the first common layer 232. Dividing the first common layers in this manner is effective to reduce or cut off leakage current. In another embodiment, leakage current may be reduced or cut off by dividing the first common layer 232 and/or the second common layer 234 into first common layers and/or second common layers, each having a size smaller than that of the first common layer 232 and/or the second common layer 234.

Figure 4A:
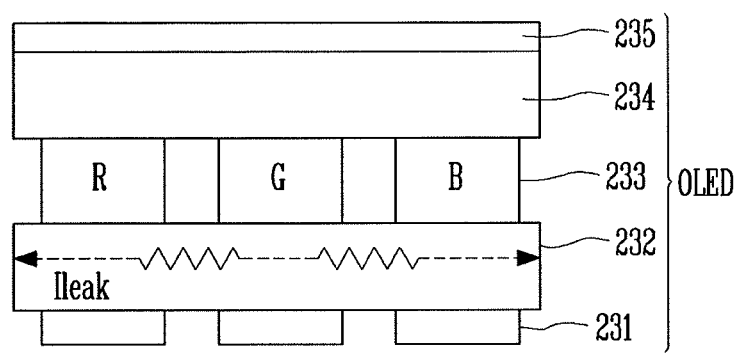
FIGS. 4A and 4B illustrate an embodiment of a method for cutting off leakage current in the pixel.
Figure 4B:
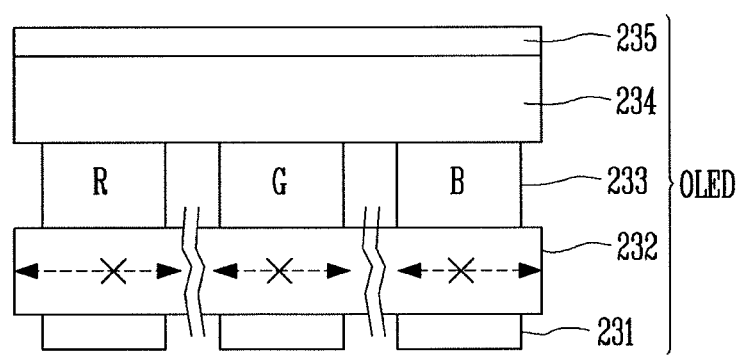

FIGS. 4A and 4B illustrate a sectional views that correspond to one embodiment of a method for reducing or cutting off leakage current. For convenience, only OLEDs of three adjacent pixels are shown. FIG. 5 illustrates a plan view illustrating divided common layers according to this embodiment.

Referring to FIG. 4A, leakage current may be generated in the first common layer 232 and/or the second common layer 234, so that a plurality of pixels share the first common layer 232 and/or the second common layer 234. For example, leakage current Ileak may be generated along the first common layer 232 between the pixels due to parasitic resistance of the first common layer 232.

In this case, the second electrode 235 of OLED 235 is coupled to the second pixel power source ELVSS. Therefore, if the leakage current Ileak flows in the first common layer 232, the OLED in which the driving current from pixel circuit 12 is cut off (i.e., the OLED to implement a black gray scale value by non-emission) may be slightly turned on by leakage current Ileak, so that a small amount of light is generated. This increases black luminance, and therefore results in deterioration of image quality.

In order to overcome this problem, in one embodiment, the common layer in which leakage current flows (e.g., the first common layer 232) is divided by being cut at regions between the pixels, as shown in FIG. 4B. Accordingly, it is possible to prevent abnormal emission of the OLED caused by leakage current Ileak, thereby improving black luminance.

Although FIG. 4B illustrates that only the first common layer 232 is divided, in other embodiments only the second common layer 234 may be divided, or both the first and second common layers 232 and 234 may be divided, to produce a cut-off effect for the leakage current Ileak.

Also, although FIG. 4B illustrates that the first common layer 232 is divided for each pixel, the first common layer 232 and/or the second common layer 234 may be practically divided in units of a plurality of pixels.

For example, as shown in FIG. 5, the first common layer 232 and/or the second common layer 234 are/is formed by being patterned in a stripe shape in the horizontal direction on the pixel unit 20. As a result, pixels 10 on consecutive horizontal pixel lines share a single first common layer 232 and/or a single second common layer 234. In one embodiment, the first common layer 232 and/or second common layer 234 may be divided by being cut between the pixels 10 (e.g., an upper portion of the pixel defining layer) in the unit of b vertical pixel lines along the vertical direction of the pixel unit 20.

When the first common layer 232 and/or the second common layer 234 are/is formed by being patterned in a stripe shape in the vertical direction on the pixel unit 20, pixels 10 positioned on consecutive b vertical pixel lines share a single first common layer 232 and/or a single second common layer 234. In this case, the first common layer 232 and/or the second common layer 234 may be divided by being cut between the pixels 10 in a unit of horizontal pixel lines in the horizontal direction of pixel unit 20.

When the first common layer 232 and/or the second common layer 234 are/is entirely formed on the pixel unit 20, all pixels 10 share a single first common layer 232 and/or a single second common layer 234. In this case, the first common layer 232 and/or the second common layer 234 may be divided by being cut along the horizontal direction and/or the vertical direction of the pixel unit 20.

FIG. 5 illustrates the embodiment where the first common layer 232 and/or the second common layer 234 are/is formed on the pixel unit 20, by being patterned so that pixels on a plurality of horizontal pixel lines and/or a plurality of vertical pixel lines share a single first common layer 232 and/or a single second common layer 234. In o the embodiments, the first common layer 232 and/or second common layer 234 may be formed on the pixel unit 20 by being patterned so that pixels one horizontal or vertical pixel line share a single first common layer 232 and/or a single second common layer 234.

In this embodiment, the first common layer 232 and/or the second common layer 234 are/is formed by being patterned so that a plurality of pixels 10, e.g., k (k is a natural number of 2 or more) pixels 10 share a single first common layer 232 and/or a single second common layer 234. Then, the first common layer 232 and/or the second common layer 234 are/is divided, so that one or more pixels 10 having a number smaller than that of the k pixels 10 shares a single first common layer 232 and/or a single second common layer 234.

For example, in the dividing of the first common layer 232 and/or the second common layer 234, one first common layer 232 and/or one second common layer 234 (commonly formed with respect to pixels 10 in the unit of one or more horizontal pixel lines or one or more vertical pixel lines) may be divided into at least two first common layers 232 and/or at least two second common layers 234.

The first common layer 232 and/or the second common layer 234 may be divided into at least two first common layers 234 and/or at least two second common layers 234. The divided layers may be disposed with respect to each of one or more horizontal pixel lines and one or more vertical pixel lines. In this case, the first common layer 232 and/or the second common layer 234 may be divided into at least two, based on each of the horizontal and vertical pixel lines on the pixel unit 20.

In the present embodiment, after the process of forming the OLED to include the first common layer 232 and/or the second common layer 234 is completed (e.g., after the fabricating process for individual panels is completed), the first common layer 232 and/or the second common layer 234 are/is divided into common layers, each having a size smaller than that patterned in the process of forming the first common layer 232 and/or the second common layer 234. This may be accomplished, for example, by applying physical pressure to the panel of the organic light emitting display.

That is, the first common layer 232 and/or the second common layer 234 of the OLED may be formed by being patterned, so that a plurality of pixels 10 share a single first common layer 232 and/or a single second common layer 234. In this case, the first common layer 232 and/or the second common layer 234 may be divided into common layers having a smaller size, which are spaced from one another. This may be accomplished by applying physical pressure to the first common layer 232 and/or the second common layer 234, after the panel fabricating process including the process of forming the OLED is completed.

For example, the first common layer 232 and/or the second common layer 234 may be divided by applying a force in the vertical direction of a plane on which the substrate is disposed (a plane on which the panel is disposed), after the panel fabricating process is completed.

Accordingly, leakage current is effectively reduced or cut off through the first common layer 232 and/or the second common layer 234. Accordingly, it is possible to prevent an increase of luminance caused by leakage current, thereby improving image quality of the organic light emitting display.

Figure 6:
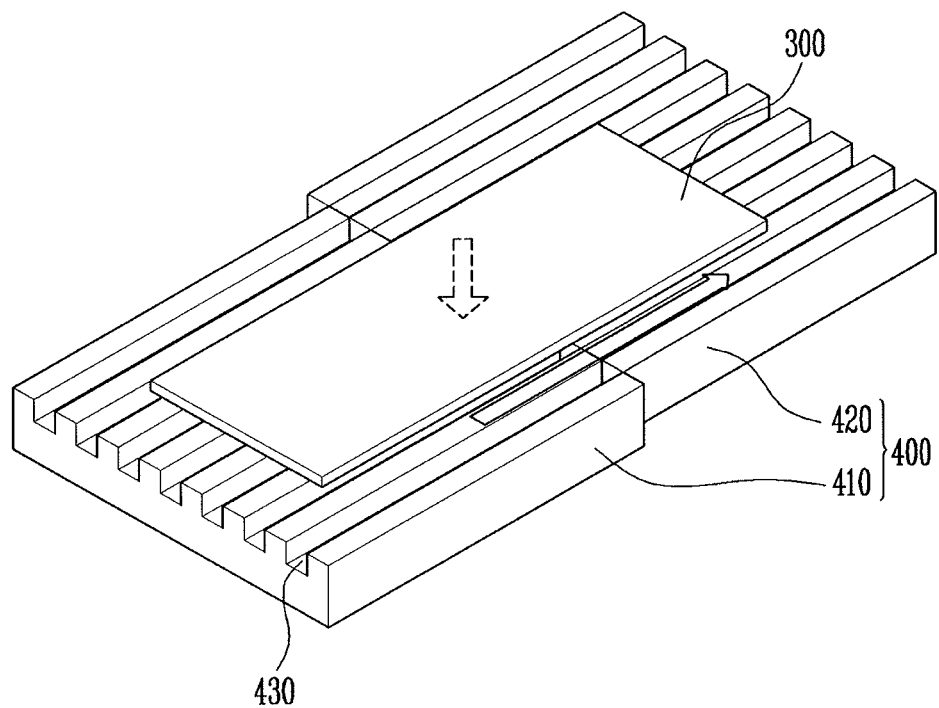
FIG. 6 illustrates an embodiment of a method for dividing a common layer.

FIG. 6 illustrates another embodiment of a method of dividing the common layer in the organic light emitting display device. For convenience, it is assumed that organic light emitting diodes formed in a panel include at least one first common layer. However, in a case where the organic light emitting diodes include only a second common layer, the dividing process may divide the second common layer. Also, in a case where the organic light emitting diodes include both the first and second common layers, the second common layer may be simultaneously divided together with the first common layer.

Referring to FIG. 6, a panel 300 of the organic light emitting display, which is fabricated to include at least organic light emitting diode, is placed on a substrate support 400 having a plurality of grooves 430 formed therein. A first common layer in panel 300 is then divided by applying pressure. This pressure may be transferred to the first common layer of the organic light emitting diodes formed in the panel 300.

For example, dividing the first common layer may include placing panel 300 on substrate support 400 having a plurality of grooves 430. The panel 300 is formed to include one or more organic light emitting diodes, each including at least a first electrode, a first common layer, an emission layer, and a second electrode. The first common layer is pressed and divided by moving panel 300 and/or substrate support 400 in a second direction intersecting a first direction, while pressing panel 30 with a force applied in the first direction perpendicular to the panel 300.

The first direction may be a direction facing top to bottom, like the direction of the arrow shown by a dotted line of FIG. 6. The second direction intersects the first direction and may be, for example, a direction perpendicular to the first direction, i.e., a direction horizontal to the panel 300.

The force applied to panel 300 may have intensity such that the first common layer is at least partially cut, by pressing the first common layer in the panel 300. In this case, the intensity of the force may be set to be smaller than one which causes a driving failure due to breakdown of the panel 300, or one which causes damage of another driving electrode, device, or line.

As described in FIG. 3, the first common layer 232 may be formed to be coupled to areas of a plurality of pixels 10R, 10G, and 10B via an upper portion of the pixel defining layer 220. In this case, when a pressing force is applied to panel 300 on the substrate support 400 having grooves 430 formed therein as shown in FIG. 6, the first common layer 232 on the pixel defining layer 220 is easily cut. Accordingly, it is possible to easily divide the first common layer 232 in regions between the pixels 10R, 10G, and 10B. In one embodiment, the force pressing the panel 300 may be equally applied to the entire surface of the panel 300, in order to prevent a large force from being concentrated on only a portion of the panel 300.

In FIG. 3, the second electrode 235 may be formed of a material having high flexibility, compared with the material of the first common layer 232 which may be easily cut or broken. The second electrode 235 may be entirely formed on the pixel unit.

Thus, the material(s) of the first common layer 232 and/or second electrode 235 may be selected by taking into consideration of the process of dividing the first common layer 232. Also, the process of dividing the first common layer 232 may be performed by optimizing the force pressing the panel 300 according to the design conditions of the panel 300. It is therefore possible to easily divide the first common layer 232, while at the same time preventing a driving failure resulting from disconnection of the second electrode 235.

The substrate support 400 may be configured to include a plurality of regions (e.g., a first region 410 and a second region 420), each having a plurality of grooves 430. The grooves 430 may be formed, for example, at a predetermined interval. For example, each of the first and second regions 410 and 420 may have a plurality of grooves 430 having the same interval and width. The grooves 430 in the first and second regions 410 and 420 may be alternately disposed. In this case, the first common layer 232 may be more elaborately divided.

When at least one region of the panel 300 is placed in the first region 410 on the substrate support 400, the panel 300 may be moved onto the second region 420 on the substrate support 400. This may be accomplished by moving the panel 300 and/or the substrate support 400 in the second direction intersecting the first direction, while applying a force in the first direction perpendicular to the panel 300.

In the aforementioned method embodiment, the first common layer 232 may be divided by applying physical pressure to the panel 300 after the panel 300 is fabricated. That is, this embodiment may include dividing first common layer 232 while applying physical pressure to first common layer 232, in addition to forming the organic light emitting diode on the substrate 200 as described with reference FIGS. 2 and 3.

Dividing the first common layer 232 may be performed, for example, in a state where a sealing process and a scribing process of dividing the panel into individual panels 300 are completed. For example, dividing the first common layer 232 may be performed before, during, or after a process of attaching a polarizing plate on panel 300.

For example, the first common layer 232 may be divided by applying physical pressure to panel 300 before, during, or after a process of attaching a polarizing plate on the panel 300. During this process, substrate support 400 having grooves as shown in FIG. 6 may be used as the substrate support having individual panels 300 mounted thereon. In this case, the first common layer 232 can be easily divided without adding a separate complicated fabricating process, thereby simplifying the fabricating process.

Figure 7:
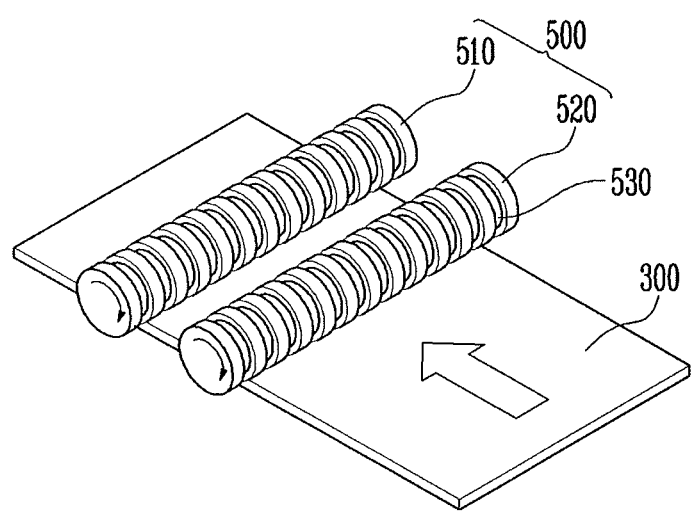
FIG. 7 illustrates another embodiment of a method for dividing a common layer.

FIG. 7 illustrates another embodiment of a method for dividing the common layer in the organic light emitting display device. Referring to FIG. 7, the first common layer in panel 300 may be divided, without using a grooved substrate support 400 as shown in FIG. 6, but rather by using a roller 500 having grooves 530 formed therein.

More specifically, in this embodiment, the common layer in the organic light emitting display may be divided by applying a roller 500 with grooves 530 to panel 300. The panel 300 may include organic light emitting diodes, each including at least a first electrode, a first common layer, an emission layer, and a second electrode. The first common layer in the panel 300 is divided by moving roller 500 and/or panel 300 in a second direction intersecting a first direction, while pressing panel 300 with a force in the first direction perpendicular to panel 300 while rotating the roller 500.

According to one embodiment, a plurality of rollers 510 and 520 may be used. Each of the rollers 510 and 520 may include grooves 530 spaced at a predetermined interval. The rollers 510 and 520 may be rotated, so that grooves 530 are alternately positioned to cross each other. In this case, the first common layer may be more elaborately divided. Grooves 530 in roller 500 may be formed in a surface which contacts panel 300. The size and direction of grooves 530 may be variously modified.

Figure 8:
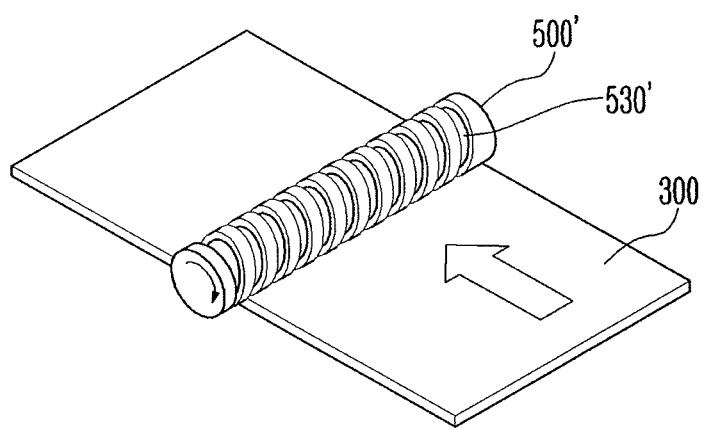
FIG. 8 illustrates another embodiment of a method for dividing a common layer.

FIG. 7 illustrates another embodiment of a method for dividing the common layer in the organic light emitting display device. As shown in FIG. 8, the first common layer may be divided using one or more rollers 500' having a plurality of diagonal grooves 530'. The one or more rollers 500' are disposed on panel 300, and the first common layer may be divided by rotating rollers 500' while pressing panel 300 with the rollers 500'.

When the first common layer is divided into common layers, each having a size smaller than that patterned in the process of forming the common layer as described above, leakage current through the first common layer is effectively reduced or cut off Accordingly, it is possible to prevent an increase in black luminance, thereby improving image quality of the organic light emitting display.

By way of summation and review, in an organic light emitting display, driving current is supplied to an organic light emitting diode corresponding to a data signal. Accordingly, light with a luminance based on the data signal is emitted to express a corresponding gray scale value. When a black gray scale value is to be implemented, the data signal has a value which cuts off the driving current to the organic light emitting diode. As a result, the organic light emitting diode does not emit light.

However, because of leakage current, the pixel which is to express a black gray scale value may emit some level of light. That is, an increase in luminance may occur because the organic light emitting diode is slightly turned on. Therefore, the black gray scale may not be completely expressed. As a result, image quality may deteriorate.

In accordance with one or more of the aforementioned embodiments, an organic light emitting display and fabricating method are provided in which multiple pixels share a common layer. This is accomplished by dividing the common layer into common layers of smaller size, which are spaced apart from each other. The common layer may be divided by applying physical pressure after completion of a panel fabricating process, including one for forming organic light emitting diodes. Accordingly, leakage current is effectively reduced or cut off. Thus, an increase in luminance caused by the leakage current may be prevented and image quality of the organic light emitting display may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A method of making a display device, the method comprising:
    forming first electrodes of organic light emitting diodes (OLEDs) in respective pixel areas on a substrate;
    forming a first common layer on the first electrodes in the pixel areas;
    forming emission layers in the pixel areas on the first common layer;
    forming a second electrode of the OLEDs on the emission layer; and
    applying physical pressure to divide the first common layer.

2. The method as claimed in claim 1, wherein apply the physical pressure includes applying a force to the first common layer in a different direction of a plane including the substrate.

3. The method as claimed in claim 1, wherein applying the physical pressure includes:

placing a panel on a substrate support having a plurality of grooves, the panel including the first electrodes, the first common layer, the emission layers, and the second electrode; and moving at least one of the panel or the substrate support in a second direction intersecting a first direction, while applying a force in the first direction to divide the first common layer.

4. The method as claimed in claim 3, wherein:

the substrate support includes first and second regions, each having grooves at a predetermined interval, the grooves in adjacent regions alternately positioned to cross each other, and the method further includes moving the panel onto the second region on the substrate support when at least one region of the panel is positioned in the first region on the substrate support, wherein moving the panel includes applying the force to the panel in the first direction.

5. The method as claimed in claim 4, wherein each of the first and second regions of the substrate support includes a plurality of grooves having substantially a same interval and width.

6. The method as claimed in claim 3, wherein the first direction is perpendicular to the second direction.

7. The method as claimed in claim 1, wherein applying the physical pressure includes:

applying a force to a panel in a first direction while rotating at least one roller in a second direction crossing the first direction, the at least one roller including a plurality of grooves and the panel including the first electrodes, the first common layer, the emission layers, and the second electrode.

8. The method as claimed in claim 7, wherein applying the physical pressure includes rotating a plurality of rollers on the first common layer, each of the rollers having grooves at a predetermined interval and the rollers are rotated so that the grooves of the rollers are alternately positioned.

9. The method as claimed in claim 7, wherein applying the physical pressure includes rotating a plurality of rollers on the first common layer, each of the rollers having a plurality of diagonal grooves.

10. The method as claimed in claim 1, wherein:

k OLEDs share the first common layer, where k≥2, and one or more pixels having a number smaller than the k pixels share the divided first common layer.

11. The method as claimed in claim 1, wherein:

pixels in a horizontal or vertical line share the first common layer, and applying the physical pressure divides the first common layer into at least two first common layers.

12. The method as claimed in claim 11, wherein the at least two first common layers are divided relative to the horizontal and vertical pixel lines.

13. The method as claimed in claim 1, further comprising:

forming a second common layer on the emission layer to allow a plurality of pixels to share the second common layer, wherein the second coming layer is formed between forming the emission layers and forming of the second electrode.

14. The method as claimed in claim 13, wherein the second common layer is simultaneously divided with the first common layer.

15. The method as claimed in claim 1, wherein:

the first electrodes and emission layers are patterned for corresponding pixels, and the second electrode is entirely formed on a pixel unit so that all the pixels share the second electrode.

* * * * *